(12) United States Patent
Li et al.

(10) Patent No.: US 9,182,661 B2
(45) Date of Patent: Nov. 10, 2015

(54) SCREENING METHOD AND APPARATUS FOR USE IN INTAGLIO PRINTING

(75) Inventors: Haifeng Li, Beijing (CN); Bin Yang, Beijing (CN)

(73) Assignees: Peking University Founder Group Co., Ltd., Beijing (CN); Peking University, Beijing (CN); Beijing Founder Electronics Co., Ltd., Beijing (CN); Peking University Founder R&D Center, Beijing (CN)

( * ) Notice: Subject to any disclaimer, the term of this patent is extended or adjusted under 35 U.S.C. 154(b) by 100 days.

(21) Appl. No.: 13/996,967

(22) PCT Filed: Dec. 24, 2011

(86) PCT No.: PCT/CN2011/084593
§ 371 (c)(1),
(2), (4) Date: Oct. 8, 2013

(87) PCT Pub. No.: WO2012/083885
PCT Pub. Date: Jun. 28, 2012

(65) Prior Publication Data
US 2014/0033937 A1 Feb. 6, 2014

(30) Foreign Application Priority Data
Dec. 24, 2010 (CN) .......................... 2010 1 0621998

(51) Int. Cl.
*H04N 1/405* (2006.01)
*G03F 5/20* (2006.01)

(52) U.S. Cl.
CPC ................ *G03F 5/20* (2013.01); *H04N 1/4055* (2013.01)

(58) Field of Classification Search
CPC .............. H04N 1/4055; H04N 1/4058; H04N 1/40087; H04N 1/405; H04N 1/52; H04N 1/4057; G03F 5/00; G03F 5/16

USPC .......... 358/1.9, 2.1, 536, 3.3–3.32, 3.2–3.21, 358/3.01–3.02, 3.1–3.14
See application file for complete search history.

(56) References Cited

U.S. PATENT DOCUMENTS

| | | | |
|---|---|---|---|
| 6,989,854 B1 * | 1/2006 | Figov et al. | 347/244 |
| 7,164,504 B1 * | 1/2007 | Yamazaki | 358/3.08 |
| 2007/0036039 A1 * | 2/2007 | Kawahara et al. | 369/13.01 |

FOREIGN PATENT DOCUMENTS

| | | |
|---|---|---|
| CN | 1624583 A | 6/2005 |
| CN | 1648769 A | 8/2005 |
| JP | 11342679 A | 12/1999 |

OTHER PUBLICATIONS

PCTCN2011084593, International Search Report & Written Opinion mailed Mar. 29, 2012, 17 pages.
Song, Y et al. Research into the Implementation of Non-uniform Shape Dot and Its Transmission Characteristics, pp. 7-9 pages, Journal of Beijing Institute of Graphic Communication, Dec. 2004.
Jiang, W et al., Influence of Dot's Shape on Dot Reproduction Attributes of Offset Printing, Packaging Engineering. Jan. 2010, pp. 82-84.

* cited by examiner

*Primary Examiner* — Thomas D Lee
*Assistant Examiner* — Stephen M Brinich
(74) *Attorney, Agent, or Firm* — Lathrop & Gage LLP

(57) ABSTRACT

The present application provides a screen method for intaglio printing, comprising: dividing multiple classes of regions according to a brightness range; and generating screen dots with various screen patterns for the grouped classes of regions. The present application also provides a screen device for intaglio printing, comprising: a dividing module configured to group multiple classes of regions according to the brightness range; and a generating module configured to generate screen dots with various screen patterns for the grouped classes of regions. Since multiple kinds of screen patterns are applied in the technical solutions in present application, the problem, i.e., water ripple will occur in the prior art, may be addressed, so as to improve the quality of printing.

5 Claims, 3 Drawing Sheets

SCREENING METHOD AND APPARATUS FOR USE IN INTAGLIO PRINTING

TECHNICAL FIELD

The application relates to a printing field, in particular to a screening method and a screening device for use in intaglio printing.

BACKGROUND OF THE APPLICATION

In the intaglio printing (gravure, for short), screen dots are concave relative to a surface of the plate. When printing, the printing ink is filled in the concave screen dots and is transferred to medium by imprinting.

Due to the above features of the intaglio printing, there is a space similar to a wall between screen dots, i.e., "screen wall". Concave screen dots are formed on the plate regardless of whether the platemaking the intaglio printing is finished in a manner of manual corrosion or in a manner of electrographic engraving. Therefore, change rules of the "screen wall" are very important, in particular, in dark areas.

The inventors found that the pattern of the "screen wall" and the change rule of the "screen wall" in the dark areas directly influence gradation quality and texture of the dark portions during the intaglio printing. During the intaglio printing, the "screen wall" becomes thinner relatively as the gradation becomes darker, i.e., the screen dots become larger. However, the "screen wall" becomes thinner, and thus it will make the "screen wall" to fracture or have non-uniform thickness or the like, which will cause problems, for example the dark area will present texture or "water ripple". That is, in the conventional art, the pattern of intaglio printing screen dot (i.e., screen pattern) is square and the pattern of "screen wall" is normal rectangle, but the "screen wall" will change as amplitude modulation screening points change due to the gradation changes. The screen pattern in the change process is similar to rectangle but is not rectangle, the thickness of the rectangle is non-uniform, which will cause texture or "water ripple".

SUMMARY OF THE APPLICATION

The present application intends to provide a screening method and a screening device for use in intaglio printing so as to address the problem in the prior art, for example, to avoid the water ripple.

An embodiment of the present application provides a screening method for use in intaglio printing, comprising a step of dividing tonal zones to be printed into a plurality of classes of regions according to brightness ranges of the zones; and a step of generating screen dots of different screen pattern for different classes of regions.

Another embodiment of the present application provides a screening device for use in intaglio printing, comprising: a dividing module configured to divide tonal zones in the intaglio printing into a plurality of classes of regions according to brightness ranges of the zones; and a generating module configured to generate screen dots of different screen pattern for different classes of regions.

Since multiple kinds of screen patterns are applied in the technical solutions in present application, the problem, i.e., water ripple will occur in the prior art, may be addressed, and thus the quality of printing will be improved.

BRIEF DESCRIPTION OF THE DRAWING

The following drawings are provided to facilitate further understanding of the present invention, and consist of a part of disclosure of the present invention. The exemplary embodiments and description thereof are used to explain the present invention rather than limit the present invention.

DETAILED DESCRIPTION

Hereinafter, the embodiments of the present invention will be described in detail with reference to the detailed description as well as the drawings.

Figure 1:
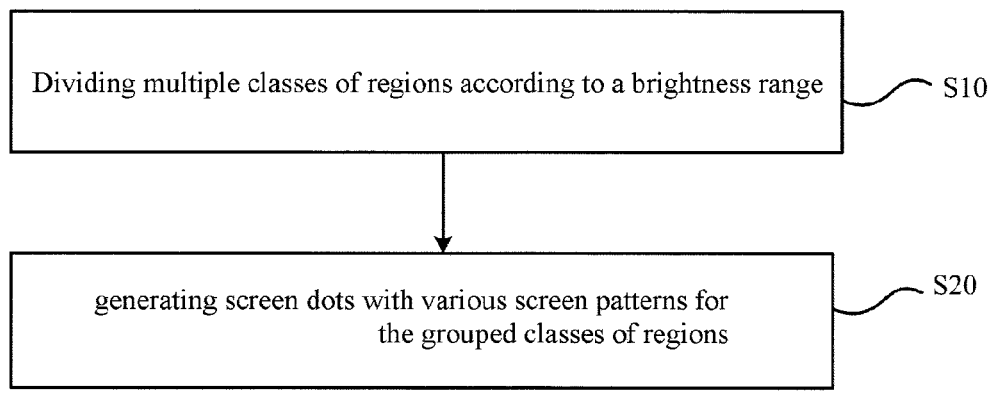
FIG. 1 shows a flowchart of the screening method for use in intaglio printing according to an embodiment of the present application.

FIG. 1 shows a flowchart of the screening method for intaglio printing according to an embodiment of the present application. The method may comprise a step 10 of determining multiple classes of regions with the brightness range, and a step 20 of generating screen dots with various screen patterns for the classes of regions.

The screen pattern of the screen dots is rectangular in the conventional intaglio printing, which will cause the water ripple in the textures. Multiple kinds of screen patterns are applied in the present application, therefore, the technical issues in the conventional intaglio, for example, water ripple may occurs, may be addressed, so that the printing quality may be improved.

Preferably, in the step S10, the region having brightness in [0, $Per_1$] is set as the light tone region; the region having brightness in [$Per_1$, $Per_2$] is set as the light tone-mid tone region; the region having brightness in [$Per_2$, $Per_3$] is set as the mid tone-dark tone region; and the region having brightness in [$Per_2$, 1] is set as the dark tone region. In the preferable embodiment, four classes of region are determined according to the brightness so that four kinds of screen patterns may be used, which has a small amount of calculation work and may obviously improve the printing quality.

Preferably, $Per_1=0.25$, $Per_2=0.5$ and $Per_3=0.8$. Through a large number of experiments, the inventors found that it will result in an optimum result when the regions are grouped as four ranges [0, 0.25], [0.25, 0.5], [0.5, 0.8] and [0.8, 1]. Certainly, the present application is not limited to the above ranges, the approximations of these ranges will be also acceptable under the spirit of the present application.

Figure 2:
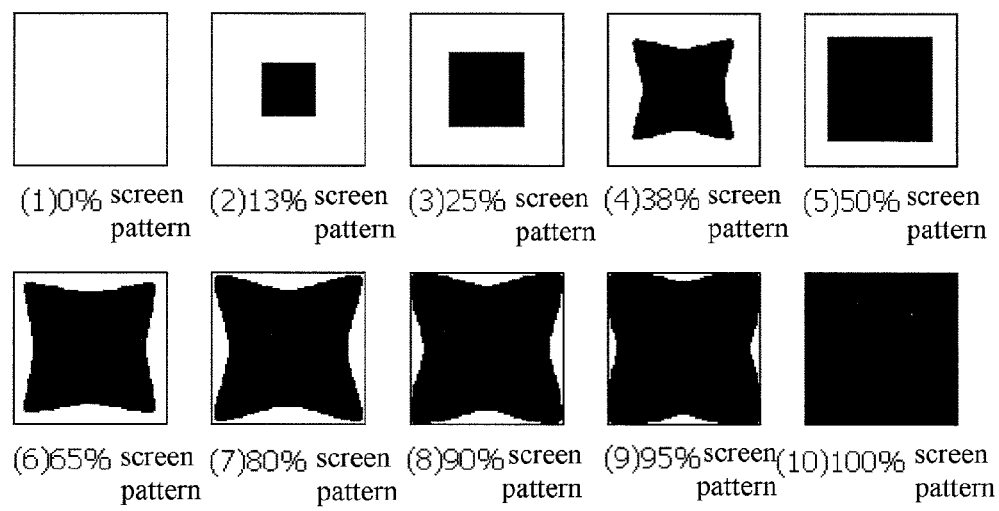
FIG. 2 shows patterns of screen dots according to a preferable embodiment of the present application.
Figure 3:
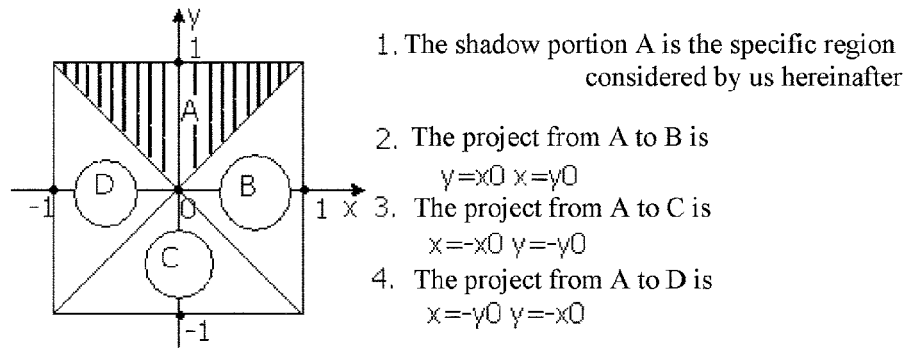
FIG. 3 shows the space symmetry of the screen dot according to a preferable embodiment of the present application.

FIG. 2 shows patterns of screen dots according to a preferable embodiment of the present application. In FIG. 2, the screen patterns change regularly. Moreover, the screen patterns of screen dots on each gradation are symmetric about the x axis and y axis in the screen dot space, and also are symmetric about two straight lines Y=±x. Therefore, only the situation where the screen pattern falls into the region y≥|x| is considered in the embodiment, the screen patterns in other regions can be anticipated through corresponding symmetry transformation, as shown in FIG. 3. The shadow portion in FIG. 3 is used as the feature screen pattern to generate the whole screen pattern in the preferable embodiment. Hereinafter, how to use a computer to generate each screen pattern shown in FIG. 2 will be described in detail.

Preferably, in the step S20, screen dots with a first screen pattern (i.e., pictures 1-3 shown in FIG. 2) are generated in the light tone region. To be specific, it establishes respective unit space for each screen dot in the light tone region, wherein the centre of each screen dot is set as the original point, x and y indicate the coordinates in the unit space for the corresponding screen dot. And then, it sets f(x,y)=max(|x|,|y|), where {(x,y)||x|≤Per$_1$,|y|≤Per$_1$}, such as {(x,y)||x|≤0.25,|y|≤0.25}.

It can be seen from the above that the first screen pattern is rectangular. That is, the pattern adopted in the embodiment provides the mathematical description of the screen pattern adopted in the light tone region shown in FIG. 2 which is easy to be realized by the computer, so as to realize the intaglio screening.

Figure 4:
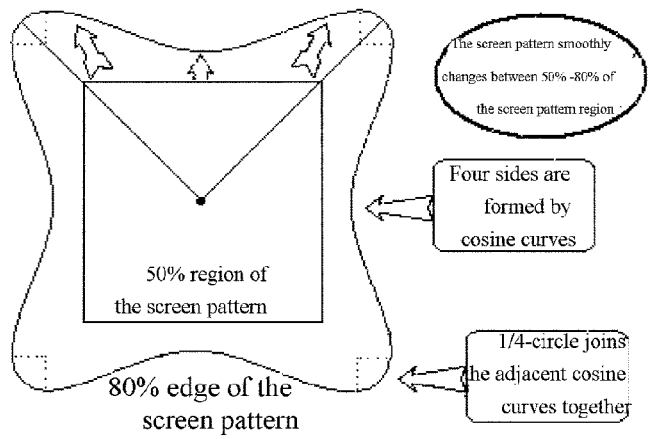
FIG. 4 shows the pattern of the screen dots in the mid tone-dark tone region according to a preferable embodiment of the present application.

FIG. 4 shows the pattern of the screen dots in the mid tone-dark tone region according to the preferable embodiment of the present application. It can be seen from FIG. 4 that in the contour of the screen pattern adopted in the mid tone-dark tone region, four sides are formed by the cosine curve and two adjacent sides are joined together by a ¼-circle to form a corner of the screen pattern. Four ¼-circles are used to join the four cosine curves together in this feature screen pattern, and the whole screen pattern gradually increases until the peak of each end of each cosine curve exactly reaches the edge of the screen dot space (therefore, 80% of the screen dots are also referred to as the feature screen pattern), as shown in FIG. 4. For example, the brightness range is [0.5, 0.8], the screen function in this stage is f(x,y)∈[0.5, 0.8].

Preferably, in the step S20, screen dots with a third screen pattern (i.e., Pictures 6-7 shown in the FIG. 2) are generated in the mid tone-dark tone region, which comprises:

1) generating respective unit space for each screen dot in the mid tone-dark tone region, where the centre of each screen dot is set as the original point, x and y indicate the coordinates in the unit space for the corresponding screen dot;

2) setting f(x,y)=0.5+0.3*t/n;

3) for the coordinate (x, y) of each screen dot in the mid tone-dark tone, comparing y with each output value $f_1$(x, t) or $f_2$(x, t) of the following formulas 4-6, so as to determine which two curves in the curves defined by formulas 4-6 form the small region into which the (x, y) falls, wherein, the rule for determination is set as: the value of y should be smaller than the output of the formulas 4-6 where t is more larger in the small region, but should be larger than the output of the formulas 4-6 where t is more small in the small region;

where, n is integer greater than 1, such as 256. In this way, the region [Per$_2$, Per$_3$] is grouped as n small regions i, i∈[1, n], and gradation t in the families of curves D(t) is uniformly divided into n points in the range [0, 1], i.e., 1/n, 2/n, 3/n, . . . , (n−1)/n, 1. The values for t are respectively put into D(t) so as to obtain curvilinear equation in term of the corresponding gradation t. t may be determined by the following formulas:

$$f_1(x, t) = \frac{\sqrt{2}}{2} + \left(1 - \frac{\sqrt{2}}{2}\right)t - \frac{t}{10d} + \frac{t}{10d}\cos\frac{x + \left[t + (1-t)\frac{\sqrt{2}}{2}\right]d}{\left[t + (1-t)\frac{\sqrt{2}}{2}\right]d},$$

$$x \in \left[-\left[t + (1-t)\frac{\sqrt{2}}{2}\right]d, \left[t + (1-t)\frac{\sqrt{2}}{2}\right]d\right],$$

where, $y = \left(1 - \frac{1}{10d}\right) + \frac{1}{10d}\cos\frac{x+d}{d}\pi,$ $x \in [-d, d], d = 1 - a;$ \hfill Formula 4

$$f_2(x, t) = m + \sqrt{n^2 - (x - m)^2}, x \in \left[m, m + \frac{\sqrt{2}}{2}n\right],$$

$m = td + (1-t)k, n = (1-t)(1 - \sqrt{2}k) - t(1-d),$ where, $y = d + \sqrt{(1 - x - 2d)(1 + x)},$ $x \in \left[-\frac{\sqrt{2}}{2}a - d, -d\right];$ \hfill Formula 5

$$f_2(x, t) = m + \sqrt{n^2 - (x + m)^2}, x \in \left[-m - \frac{\sqrt{2}}{2}n, -m\right],$$

$m = td + (1-t)k, n = (1-t)(1 - \sqrt{2}k) - t(1-d),$ where, $y = d + \sqrt{(1 + x - 2d)(1 - x)},$ $x \in \left[d, d + \frac{\sqrt{2}}{2}a\right];$ \hfill Formula 6

In formulas 4-6, $a \in (0, 0.1], t \in [0, 1].$

The equation set for the families of curves D(t), {D(t')|t'∈[0, 1]}, is formed by the formulas 4-6, wherein t is the gradation during the change of the screen pattern. In the brightness range, each t may be indicated by a curve formula. The feature screen pattern is generated by D(t), wherein, the cosine curve in the feature screen pattern is generated by the formula 4 and two ⅛-circles are generated by the formulas 5 and 6. Since the two ⅛-circles are bilaterally symmetrical, the formula 6 may be obtained from the formula 5 by taking values x' symmetrical to x about the coordinate of the centre of the screen dots, i.e., x'=−x, wherein x' is the symmetry of x coordinate screen dot.

The embodiment provides the mathematical description of the screen pattern adopted in the mid tone-dark tone region shown in FIG. 2 which is easy to be realized through the computer, so as to realize the intaglio screening.

Preferably, in the step 20, screen dots with a second screen pattern (i.e., pictures 4-5 shown in the FIG. 2) are generated in the light tone-mid tone region through the following steps:

a) generating respective unit space for each screen dot in the light tone-mid tone region, wherein the centre of each screen dot is set as the original point, x and y indicate the coordinates in the unit space for the corresponding screen dot;

b) setting f(x,y)=0.5+0.3*t/n;

c) for each coordinate (x, y) of each screen dot in the dark tone, comparing y with each output value $f_1$(x, t) or $f_2$(x, t) of the following formulas 7-9, so as to determine which two curves in the curves defined by formulas 7-9 form the small region into which the (x, y) falls, wherein, the rule for determination is: the value of y should be smaller than the output of the formulas 7-9 where t is more larger in the small region, and should be larger than the output of the formulas 7-9 where t is more small in the small region.

n is integer greater than 1. The equation set for t is:

$$f_1(x, t) = \frac{1}{2}\left(\frac{\frac{\sqrt{2}}{2} + \left(1 - \frac{\sqrt{2}}{2}\right)t - \frac{t}{10d} +}{\frac{t}{10d}\cos\frac{x + \left[t + (1-t)\frac{\sqrt{2}}{2}\right]d}{\left[t + (1-t)\frac{\sqrt{2}}{2}\right]d}\pi}\right),$$

$$x \in \left[-\frac{\sqrt{2}}{2}\left[t + (1-t)\frac{\sqrt{2}}{2}\right]d, \frac{\sqrt{2}}{2}\left[t + (1-t)\frac{\sqrt{2}}{2}\right]d\right],$$

where, $y = \frac{1}{2}\left(\left(1 - \frac{1}{10d}\right) + \frac{1}{10d}\cos\frac{x+d}{d}\pi\right)$, $$x \in \left[-\frac{\sqrt{2}}{2}d, \frac{\sqrt{2}}{2}d\right], d = 1 - a;$$

Formula 1

$$f_2(x, t) = \frac{1}{2}m + \frac{1}{2}\sqrt{n^2 - (x-m)^2},$$

Formula 2

$$x \in \left[\frac{\sqrt{2}}{2}m, \frac{\sqrt{2}}{2}m + \frac{1}{2}n\right],$$

$m = td + (1-t)k, n = (1-t)(1 - \sqrt{2}\,k) - t(1-d),$ where, $y = \frac{1}{2}d + \frac{1}{2}\sqrt{(1-x-2d)(1+x)}$, $$x \in \left[-\frac{1}{2}a - \frac{\sqrt{2}}{2}d, -\frac{\sqrt{2}}{2}d\right];$$

$$f_2(x, t) = \frac{1}{2}m + \frac{1}{2}\sqrt{n^2 - (x-m)^2},$$

Formula 3

$$x \in \left[-\frac{\sqrt{2}}{2}m - \frac{1}{2}n, -\frac{\sqrt{2}}{2}m\right],$$

$m = td + (1-t)k, n = (1-t)(1 - \sqrt{2}\,k) - t(1-d),$ where, $y = \frac{1}{2}d + \frac{1}{2}\sqrt{(1+x-2d)(1-x)}$, $$x \in \left[\frac{\sqrt{2}}{2}d, \frac{\sqrt{2}}{2}d + \frac{1}{2}a\right];$$

In the above formulas 1-3, $a \in (0, 0.1], t \in [0, 1]$.

The equation set for the families of curves D(t), $\{D(t)|t \in [0, 1]\}$, is formed by the formulas 1-3, wherein, t is the gradation during the change of the screen pattern. In the brightness range, each t may be indicated by a curve formula. The feature screen pattern in the light tone-mid tone region is generated by the D(t), wherein, the cosine curve in the feature screen pattern is generated by the formula 1 and two ⅛-circles are generated by the formulas 2 and 3. Since the two ⅛-circles are bilaterally symmetrical, the formula 3 may be obtained from the formula 2 by taking values x' symmetrical to x about the coordinate of the centre of the screen dots, i.e., x'=−x, wherein x' is the symmetry of x coordinate.

The brightness range in the region is [0.25, 0.5], the indication of the feature screen pattern in this region is 25%, and each point (x, y) may change in this range by rule of {(x,y) |0.25≤|x|≤√2/2, 0.25≤|y|≤√2/2}. The steps for generating the screen pattern in the light tone-mid tone are similar to that for the screen pattern in the mid tone-dark tone, the difference therebetween lies in that the screen pattern in the mid tone-dark tone is reduced at the scale ratio 1:√2, and thus the change rule and the screen function for the screen dots are determined, meanwhile the screen function in this stage is obtained, i.e., the output value of the screen function is ½ output value of the function for the light tone-mid tone region.

The embodiment provides the mathematical description of the screen pattern adopted in the light tone-mid tone region shown in FIG. 2, which is easy to be realized through the computer, so as to realize the intaglio screen printing.

Figure 5:
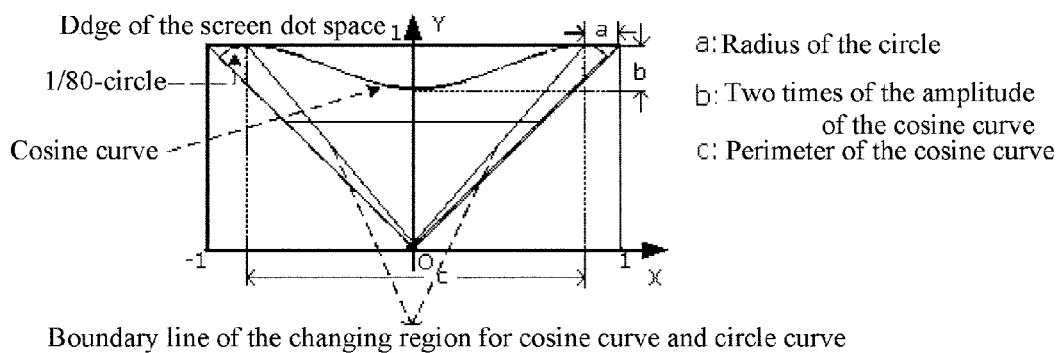
FIG. 5 shows the feature screen pattern in the dark tone region according to a preferable embodiment of the present application.

FIG. 5 shows the feature screen pattern of the dark tone region according to a preferable embodiment of the present application. The brightness range in this region is [0.8, 1]. The change rule of each screen dot in this region is set as: in the variation region of the cosine curve, 80% of the cosine curve in the feature screen pattern continuously and smoothly narrows up to the point (0, 1), while two ⅛-circles also continuously and smoothly narrow up to the points (−1, 1) and (1, 1), respectively.

Preferably, in the step 20, screen dots with a fourth screen pattern (i.e., pictures 8-10 shown in FIG. 2) are generated in the dark tone region, which comprises:

generating respective unit space for each screen dot in the dark tone region, wherein the centre of each screen dot is set as the original point, x and y indicate the coordinates in the unit space for the corresponding screen dot;

setting f(x,y)=1−0.2*t/n;

for each coordinate (x, y) of each screen dot in the dark tone, it compares y with each output value $f_1(x, t)$ or $f_2(x, t)$ of the following formulas 7-9, so as to determine which two curves in the curves defined by formulas 7-9 form the small region into which the (x, y) falls, wherein, the rule for determination is set as: the value of y should be smaller than the output of the formulas 7-9 where t is more larger in the small region, and should be larger than the output of the formulas 7-9 where t is more small in the small region.

wherein, n is integer greater than 1, such as 200. The equation set for t is:

$f_1(x, t) =$

Formula 7

$$\begin{cases} \left(1 - \frac{t}{10d}\right) + \frac{t}{10d}\cos\frac{x + td}{td}\pi, x \in [-td, td], t \in (0, 1] \\ 1, x = 0, t = 0, \end{cases}$$

$$x \in \left[-\left[t + (1-t)\frac{\sqrt{2}}{2}\right]d, \left[t + (1-t)\frac{\sqrt{2}}{2}\right]d\right],$$

where, $y = \left(1 - \frac{1}{10d}\right) + \frac{1}{10d}\cos\frac{x+d}{d}\pi$, $x \in [-d, d], d = 1 - a;$ $f_4(x, t) =$ Formula 8

$$\begin{cases} td + \sqrt{(1 - x - 2td)(1 + x)} \cdot \ldots x \in [-td, td] \ldots t \in (0, 1] \\ 1 \ldots x = 0, \end{cases}$$

where, $y = d + \sqrt{(1 - x - 2d)(1 + x)}$, $x \in \left[-\frac{\sqrt{2}}{2}a - d, -d\right];$ $f_5(x, t) =$ Formula 9

$$\begin{cases} td + \sqrt{(1 + x - 2td)(1 - x)} \cdot \ldots x \in [-td, td] \ldots t \in (0, 1] \\ 1 \ldots x = 0, \end{cases}$$

wherein, $y = d + \sqrt{(1 + x - 2d)(1 - x)}$, $x \in \left[d, d + \frac{\sqrt{2}}{2}a\right];$ In the above formulas 7-9, $a \in (0, 0.1], t \in [0, 1]$.

The equation set for the families of curves D(t), $\{D(t)|t \in [0, 1]\}$, is formed by the formulas 7-9, wherein, t is the gradation during the change of the screen pattern. In the brightness range, each t may be indicated by a curve formula. The feature screen pattern shown in FIG. 5 is generated by the D(t), wherein, the cosine curve in the feature screen pattern is generated by the formula 7 and two ⅛-circles are generated by the formulas 8 and 9. Since the two ⅛-circles are bilaterally symmetrical, the formula 9 may be obtained from the formula 8 by taking values x' symmetrical to x about the coordinate of the centre of the screen dots, i.e., x'=−x, wherein x' is the symmetry of x coordinate of screen dot.

The embodiment provides the mathematical description of the screen pattern adopted in the dark tone region shown in FIG. 2 which is easy to be realized through the computer, so as to realize the intaglio screen printing.

Figure 6:
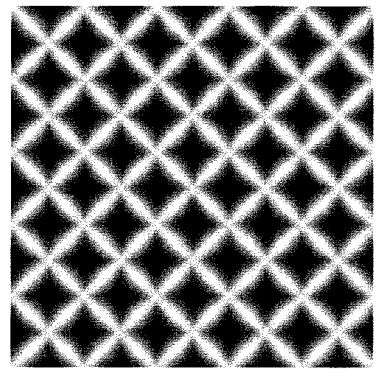
FIG. 6 shows the tiled effects of the screen dots in intaglio printing according to a preferable embodiment of the present application.

FIG. 6 shows the tiled effects of the screen dots in intaglio printing according to the preferable embodiments of the present application. In the embodiments, the screen pattern is further improved, i.e., the shape of edges of the screen dot is optimized based on the control mechanism for the cosine curve, so as to improve the printability of the screen wall, eliminate disadvantages, for example, the screen wall will crack easily and ripple in the dark part caused by the rectangular screen dot used in the conventional intaglio printing, and increase the range of reproduced gradation of the intaglio printing, so that the printing quality of the intaglio printing is obviously improved.

Figure 7:
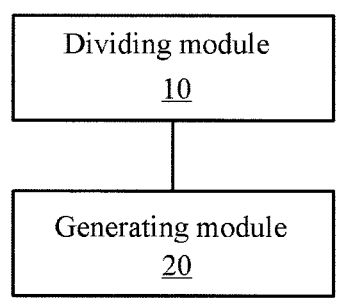
FIG. 7 shows a diagram of the device for intaglio printing according to an embodiment of the present application.

FIG. 7 shows a diagram of the device for intaglio printing according to an embodiment of the present application. The device comprises a dividing module 10 configured to determine multiple classes of regions according to the brightness range; and a generating module 20 configured to generate screen dots with various screen patterns for the grouped classes of regions.

The device improves the printing quality.

Preferably, the region having brightness in [0, Per$_1$] is set as the light tone region; the region having brightness in [Per$_1$, Per$_2$] is set as the mid tone region b; the region having brightness in [Per$_2$, Per$_3$] is set as the mid tone-dark tone region; and the region having brightness in [Per$_2$, 1] is set as the dark tone region. In the preferable embodiments, four classes of region are determined according to the brightness, so that four kinds of screen patterns may be used, which has a small amount of calculation work and may obviously improve the printing quality.

Preferably, the generating module comprises a light tone module, a light tone-mid tone module, a mid tone-dark tone module and a dark tone module.

The light tone module is configured to generate screen dots with the first screen pattern in the light tone region, wherein, respective unit space for each screen dot in the light tone region is generated by the light tone module, and wherein, the centre of each screen dot is set as the original point, x and y indicate the coordinates in the unit space for the corresponding screen dot, so that the light tone module sets f(x, y)=max(|x|,|y|), wherein, {(x,y)||x|≤Per$_1$,|y|≤Per$_1$}.

The light tone-mid tone module is configured to generate screen dots with the second screen pattern in the light tone-mid tone region. The light tone-mid tone module generates respective unit space for each screen dot in the light tone-mid tone region, wherein the centre of each screen dot is set as the original point, x and y indicate the coordinates in the unit space for corresponding screen dot. The light tone-mid tone module sets f(x,y)=0.5+0.3*t/n, wherein, n is integer greater than 1, and the equation set for t is as follows:

$$f_1(x, t) = \frac{1}{2}\left(\frac{\left(\frac{\sqrt{2}}{2} + \left(1 - \frac{\sqrt{2}}{2}\right)t - \frac{t}{10d} + \right)}{\frac{t}{10d}\cos\frac{x + \left[t + (1-t)\frac{\sqrt{2}}{2}\right]d}{\left[t + (1-t)\frac{\sqrt{2}}{2}\right]d}\pi}\right),$$ Formula 1

$$x \in \left[-\frac{\sqrt{2}}{2}\left[t + (1-t)\frac{\sqrt{2}}{2}\right]d, \frac{\sqrt{2}}{2}\left[t + (1-t)\frac{\sqrt{2}}{2}\right]d\right],$$

where, $y = \frac{1}{2}\left(\left(1 - \frac{1}{10d}\right) + \frac{1}{10d}\cos\frac{x+d}{d}\pi\right)$, $x \in \left[-\frac{\sqrt{2}}{2}d, \frac{\sqrt{2}}{2}d\right], d = 1 - a;$ $$f_2(x, t) = \frac{1}{2}m + \frac{1}{2}\sqrt{n^2 - (x - m)^2},$$ Formula 2

$$x \in \left[\frac{\sqrt{2}}{2}m, \frac{\sqrt{2}}{2}m + \frac{1}{2}n\right],$$

$m = td + (1-t)k, n = (1-t)(1 - \sqrt{2}k) - t(1-d),$ where, $y = \frac{1}{2}d + \frac{1}{2}\sqrt{(1 - x - 2d)(1 + x)}$, $x \in \left[-\frac{1}{2}a - \frac{\sqrt{2}}{2}d, -\frac{\sqrt{2}}{2}d\right];$ $$f_2(x, t) = \frac{1}{2}m + \frac{1}{2}\sqrt{n^2 - (x - m)^2},$$ Formula 3

$$x \in \left[-\frac{\sqrt{2}}{2}m - \frac{1}{2}n, -\frac{\sqrt{2}}{2}m\right],$$

$m = td + (1-t)k, n = (1-t)(1 - \sqrt{2}k) - t(1-d),$ therein, $y = \frac{1}{2}d + \frac{1}{2}\sqrt{(1 + x - 2d)(1 - x)}$, $x \in \left[\frac{\sqrt{2}}{2}d, \frac{\sqrt{2}}{2}d + \frac{1}{2}a\right];$ In the above formulas 1-3, $a \in (0, 0.1], t \in [0, 1]$.

The mid tone-dark tone module is configured to generate screen dots with the third screen pattern in the mid tone-dark tone region. The mid tone-dark tone module generates respective unit space for each screen dot in the mid tone-dark tone region, wherein the centre of each screen dot is set as the original point, x and y indicate the coordinates in the unit space for corresponding screen dot. The mid tone-dark tone module sets f(x,y)=0.5+0.3*t/n, wherein, n is integer greater than 1, and the equation set for t is as follows:

$$f_1(x, t) =$$ Formula 4

$$\frac{\sqrt{2}}{2} + \left(1 - \frac{\sqrt{2}}{2}\right)t - \frac{t}{10d} + \frac{t}{10d}\cos\frac{x + \left[t + (1-t)\frac{\sqrt{2}}{2}\right]d}{\left[t + (1-t)\frac{\sqrt{2}}{2}\right]d},$$

$$x \in \left[-\left[t + (1-t)\frac{\sqrt{2}}{2}\right]d, \left[t + (1-t)\frac{\sqrt{2}}{2}\right]d\right],$$

where, $y = \left(1 - \frac{1}{10d}\right) + \frac{1}{10d}\cos\frac{x+d}{d}\pi$, $x \in [-d, d], d = 1 - a;$ -continued $$f_2(x, t) = m + \sqrt{n^2 - (x-m)^2}, \ x \in \left[m, m + \frac{\sqrt{2}}{2}n\right],$$ Formula 5
$$m = td + (1-t)k, n = (1-t)(1-\sqrt{2}k) - t(1-d),$$
where, $y = d + \sqrt{(1-x-2d)(1+x)}$,
$$x \in \left[-\frac{\sqrt{2}}{2}a - d, -d\right];$$

$$f_2(x, t) = m + \sqrt{n^2 - (x+m)^2}, \ x \in \left[-m - \frac{\sqrt{2}}{2}n, -m\right],$$ Formula 6
$$m = td + (1-t)k, n = (1-t)(1-\sqrt{2}k) - t(1-d),$$
where, $y = d + \sqrt{(1+x-2d)(1-x)}$,
$$x \in \left[d, d + \frac{\sqrt{2}}{2}a\right];$$

In formulas 4-6, $a \in (0, 0.1], t \in [0, 1]$.

The dark tone module is configured to generate screen dots with the fourth screen pattern in the dark tone region. The dark tone module generates respective unit space for each screen dot in the dark tone region, wherein the centre of each screen dot is set as the original point, x and y indicate the coordinates in the unit space for corresponding screen dot. The dark tone module sets f(x,y)=1−0.2*t/n, wherein, n is integer greater than 1, and the equation set for t is as follows:

$$f_1(x, t) =$$ Formula 7
$$\begin{cases} \left(1 - \frac{t}{10d}\right) + \frac{t}{10d}\cos\frac{x+td}{td}\pi, x \in [-td, td], t \in (0, 1] \\ 1, x = 0, t = 0, \end{cases}$$
$$x \in \left[-\left[t + (1-t)\frac{\sqrt{2}}{2}\right]d, \left[t + (1-t)\frac{\sqrt{2}}{2}\right]d\right],$$
where, $y = \left(1 - \frac{1}{10d}\right) + \frac{1}{10d}\cos\frac{x+d}{d}\pi$,
$x \in [-d, d], d = 1 - a;$ $$f_4(x, t) =$$ Formula 8
$$\begin{cases} td + \sqrt{(1-x-2td)(1+x)} \ \cdots \ x \in [-td, td] \ \cdots \ t \in (0, 1] \\ 1 \ \cdots \ x = 0, \end{cases}$$
where, $y = d + \sqrt{(1-x-2d)(1+x)}$, $x \in \left[-\frac{\sqrt{2}}{2}a - d, -d\right];$ $$f_5(x, t) =$$ Formula 9
$$\begin{cases} td + \sqrt{(1+x-2td)(1-x)} \ \cdots \ x \in [-td, td] \ \cdots \ t \in (0, 1] \\ 1 \ \cdots \ x = 0, \end{cases}$$
where, $y = d + \sqrt{(1+x-2d)(1-x)}$, $x \in \left[d, d + \frac{\sqrt{2}}{2}a\right];$ In the above formulas 7-9, $a \in (0, 0.1], t \in [0, 1]$.

In view of the above, based on the rectangular screen pattern in the conventional intaglio printing, the solution in the embodiment improves the screen pattern according to the special requirements on the screen dots during the plate process of the intaglio printing. That is, the shape of edges of the screen dots is optimized based on the control mechanism for the cosine curve, so that the straight line in the conventional art becomes the smooth curve so as to improve the printability of the screen wall, eliminate disadvantages, for example, the screen wall cracks easily and ripple in the dark part caused by the rectangular screen dot used in the conventional intaglio printing, and effectively increase the solid density of the intaglio printing and thus increase the range of reproduced gradation of the intaglio printing. Accordingly, the printing quality of the intaglio printing is obviously improved.

Obviously, the person skilled in the art should understand that the above modules and steps can be realized through universal computer devices which may be integrated into single computer device or distributed on a network constituting of a plurality of computer devices. Optionally, the above modules and steps can be realized by program codes which is executable by the computer devices, so that they can be stored in a memory to be executed by the computer devices; or the above modules and steps can be respectively made into respective integrated circuit modules; or a plurality of modules or steps of the above modules and steps can be made into single integrated circuit module. Therefore, the present invention is not limited by certain hardware, software and/or their combination.

Embodiments and implementations of the present application have been illustrated and described, and it should be understood that various other changes may be made therein without departing the scope of the application.

What is claimed is:

1. A screening device for use in intaglio printing, comprising:
   a dividing module configured to divide tonal zones to be printed into a plurality of classes of regions according to the brightness ranges; and
   a generating module configured to generate screen dots with various screen patterns for the classes of regions,
   wherein, the dividing module sets a region having brightness in [0, Per$_1$], a region having brightness in a light tone region[Per$_1$, Per$_2$], a region having brightness in a light tone region [Per$_2$, Per$_3$] and a region having brightness in [Per$_2$, 1] as a light tone region, a light tone-mid tone region, a mid tone-dark tone region and a dark tone region, respectively,
   and wherein Per$_1$=0.25, Per$_2$=0.5 and Per$_3$=0.8.

2. The device according to claim 1, wherein the generating module comprises:
   a light tone module configured to generate screen dots with a first screen pattern in the light tone region, wherein, respective unit space for each screen dot in the light tone region is generated by the light tone module, and centre of each screen dot is set as an original point, x and y indicate coordinates in the unit space for the corresponding screen dot, so that the light tone module sets f (x,y)=max(|x|,|y|), wherein, {(x,y)|‖x|≤Per$_1$, |y|≤Per$_1$}.

3. The device according to claim 1, wherein the generating module comprises:
   a light tone-mid tone module configured to generate screen dots with a second screen pattern in the light tone-mid tone region, wherein, the light tone-mid tone module generates respective unit space for each screen dot in the light tone-mid tone region, and wherein, centre of each screen dot is set as an original point, x and y indicate coordinates in the unit space for the corresponding screen dot, so that the light tone-mid tone module sets f (x,y)=0.5+0.3 *t/n, wherein, n is integer greater than 1, and $^t$∈[0,1].

4. The device according to claim 1, wherein the generating module comprises:
   a mid tone-dark tone module configured to generate screen dots with a third screen pattern in the mid tone-dark tone region, wherein, the mid tone-dark tone module generates respective unit space for each screen dot in the mid tone-dark tone region, and wherein, centre of each screen dot is set as an original point, x and y indicate coordinates in the unit space for corresponding screen dot, so that the mid tone-dark tone module sets $f(x,y)=0.5+0.3*t/n$, wherein, n is integer greater than 1, and $t\in[0,1]$.

5. The device according to claim 1, wherein the generating module comprises:
   a dark tone module configured to generate screen dots with a fourth screen pattern in the dark tone region, wherein, the dark tone module generates respective unit space for each screen dot in the dark tone region, and wherein, centre of each screen dot is set as an original point, x and y indicate coordinates in the unit space for corresponding screen dot, so that the dark tone module sets $f(x,y)=1-0.2*t/n$, wherein, n is integer greater than 1, and $t\in[0,1]$.

* * * * *